(12) United States Patent
Sudo

(10) Patent No.: US 10,637,484 B2
(45) Date of Patent: Apr. 28, 2020

(54) CIRCUIT DEVICE, OSCILLATOR, CLOCK SIGNAL GENERATOR, ELECTRONIC APPARATUS, AND VEHICLE

(71) Applicant: SEIKO EPSON CORPORATION, Tokyo (JP)

(72) Inventor: Yasuhiro Sudo, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/505,780

(22) Filed: Jul. 9, 2019

(65) Prior Publication Data

US 2020/0021300 A1    Jan. 16, 2020

(30) Foreign Application Priority Data

Jul. 10, 2018  (JP) ................. 2018-130436

(51) Int. Cl.
| | | |
|---|---|---|
| *H03L 7/093* | (2006.01) | |
| *H03B 5/36* | (2006.01) | |
| *H03B 5/04* | (2006.01) | |
| *H03L 1/02* | (2006.01) | |
| *H03L 7/099* | (2006.01) | |
| *H03L 7/14* | (2006.01) | |
| *H03L 7/181* | (2006.01) | |

(52) U.S. Cl.
CPC .............. *H03L 7/093* (2013.01); *H03B 5/04* (2013.01); *H03B 5/368* (2013.01); *H03L 1/026* (2013.01); *H03L 1/028* (2013.01); *H03L 7/099* (2013.01); *H03L 7/146* (2013.01); *H03L 7/181* (2013.01)

(58) Field of Classification Search
USPC .................. 327/147–149, 156–158
See application file for complete search history.

(56) References Cited

U.S. PATENT DOCUMENTS

| | | | |
|---|---|---|---|
| 6,031,880 A | 2/2000 | Li et al. | |
| 6,118,335 A | 9/2000 | Nielsen et al. | |
| 6,711,230 B1* | 3/2004 | Nicholls | G04G 3/00 |
| | | | 327/147 |
| 7,015,762 B1 | 3/2006 | Nicholls et al. | |
| 7,183,863 B1* | 2/2007 | Bedrosian | H03L 7/085 |
| | | | 327/156 |
| 7,421,048 B2* | 9/2008 | Ducharme | H04N 21/23406 |
| | | | 327/141 |

(Continued)

FOREIGN PATENT DOCUMENTS

| | | |
|---|---|---|
| JP | 2002-217722 A | 8/2002 |
| JP | 2011-061421 A | 3/2011 |

(Continued)

*Primary Examiner* — Adam D Houston
(74) *Attorney, Agent, or Firm* — Oliff PLC

(57) ABSTRACT

A circuit device includes an oscillation signal generation circuit that generates an oscillation signal by using a resonator and a processing circuit that estimates an aging characteristic of the oscillation frequency of the resonator based on the result of comparison between the phase of a reference signal based on a satellite signal transmitted from a navigation satellite and the phase of a clock signal based on the oscillation signal. The processing circuit estimates the aging characteristic based on an index value representing the reliability of the state of the received satellite signal and the result of the phase comparison.

12 Claims, 10 Drawing Sheets

(56) References Cited

U.S. PATENT DOCUMENTS

| | | | |
|---|---|---|---|
| 7,424,069 B1 | 9/2008 | Nicholls et al. | |
| 7,893,775 B2* | 2/2011 | Luiz | H03L 7/093 327/156 |
| 7,953,142 B2* | 5/2011 | Chansarkar | G01S 19/29 327/141 |
| 8,736,394 B2* | 5/2014 | Kowada | H03L 7/146 327/156 |
| 2008/0061891 A1* | 3/2008 | Hongo | G01S 7/023 331/17 |
| 2012/0007642 A1* | 1/2012 | Miyahara | H03L 7/0996 327/156 |
| 2014/0180626 A1* | 6/2014 | Kimishima | G01C 22/006 702/142 |
| 2014/0320181 A1* | 10/2014 | Mitric | H03L 7/10 327/156 |
| 2015/0127126 A1* | 5/2015 | Yamagata | G06K 9/00563 700/91 |
| 2015/0127285 A1* | 5/2015 | Shirai | G01P 7/00 702/96 |
| 2015/0222274 A1* | 8/2015 | Cenger | H03L 7/08 327/156 |
| 2015/0222276 A1* | 8/2015 | Milijevic | H03L 7/087 327/147 |
| 2015/0222280 A1* | 8/2015 | Allan | H03L 7/083 327/157 |
| 2015/0364953 A1* | 12/2015 | Rippon | H02J 13/0013 327/156 |
| 2017/0064010 A1* | 3/2017 | Song | H04L 67/16 |
| 2017/0194907 A1 | 7/2017 | Yonezawa | |
| 2017/0194967 A1 | 7/2017 | Yonezawa | |
| 2017/0194968 A1 | 7/2017 | Yonezawa | |

FOREIGN PATENT DOCUMENTS

| | | |
|---|---|---|
| JP | 2017-005594 A | 1/2017 |
| JP | 2017-123628 A | 7/2017 |
| JP | 2017-123629 A | 7/2017 |
| JP | 2017-123630 A | 7/2017 |

* cited by examiner though the reference signal is not receivable, the Kalman filter holds the true value and the gradient of the temporal change estimated when the non-holdover state changes to the holdover state. The aging corrector then generates frequency control data having undergone aging correction based on the estimated values and outputs the frequency control data to the oscillation signal generation circuit.

JP-A-2017-123628 is an example of the related art.

To perform the aging correction described above, variation in the oscillation frequency needs to be monitored. The variation in the oscillation frequency due to the aging is a long-term variation and has a small gradient of the temporal change. It is therefore necessary to follow the long-term variation in a short period and precisely estimate a small temporal change.

The reference signal for the PLL circuit is inputted, for example, from the GPS receiver to the PLL circuit, and the precision of the reference signal could undesirably vary in accordance with the state of the received satellite signal. A precise reference signal is required to perform accurate aging estimation. In a case where the precision of the reference signal decreases in accordance with the state of the received satellite signal, the precision of the aging estimation could undesirably decrease.

SUMMARY

An aspect of the present disclosure relates to a circuit device including an oscillation signal generation circuit that generates an oscillation signal by using a resonator and a processing circuit that estimates an aging characteristic of an oscillation frequency of the resonator based on a result of comparison between a phase of a reference signal based on a satellite signal transmitted from a navigation satellite and a phase of a clock signal based on the oscillation signal, and the processing circuit estimates the aging characteristic based on an index value representing reliability of a state of the received satellite signal and the result of the phase comparison.

DESCRIPTION OF EXEMPLARY EMBODIMENTS

A preferable embodiment of the present disclosure will be described below in detail. The present embodiment described below does not unduly limit the contents of the present disclosure set forth in the appended claims, and all configurations described in the present embodiment are not necessarily essential as a solution provided by the present disclosure.

1. Circuit Device, Clock Signal Generator

Figure 1:
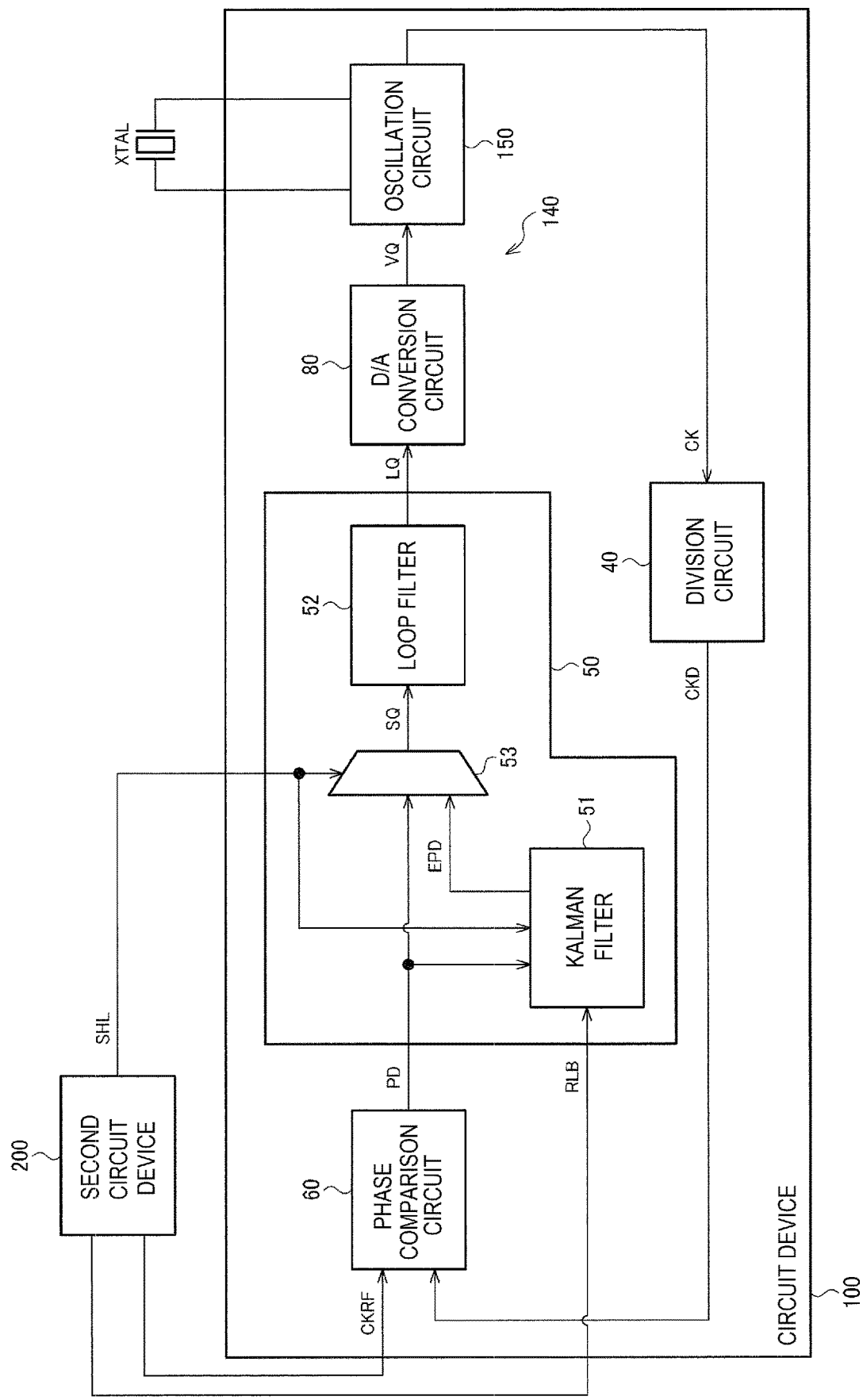
FIG. 1 shows a first configuration example of a circuit device.

FIG. 1 shows a first configuration example of a circuit device 100. The circuit device 100 includes a phase comparison circuit 60, a processing circuit 50, an oscillation signal generation circuit 140, and a division circuit 40. The circuit device 100 is, for example, an integrated circuit device.

The division circuit 40 divides a clock signal CK from an oscillation circuit 150 and outputs the result of the division as a clock signal CKD. The division circuit 40 is, for example, a counter.

The phase comparison circuit 60 compares the phase of a reference signal CKRF and the phase of the clock signal CKD and outputs phase difference data PD, which is the result of the phase comparison. The reference signal CKRF is inputted from a second circuit device 200 to the phase comparison circuit 60. The reference signal CKRF is a fixed-cycle pulse signal or clock signal and is formed, for example, of time pulses. The second circuit device 200 will be described later. The phase comparison circuit 60 includes, for example, a counter, and the counter counts one cycle of the reference signal CKRF by using the clock signal CKD. The phase comparison circuit 60 then outputs the difference between the count and a frequency set value as the phase difference data PD. The frequency set value is a value that sets the oscillation frequency and is set, for example, by a register setting. The phase comparison circuit 60 is instead a time digital conversion circuit that measures the time difference between an edge of the reference signal CKRF and an edge of the clock signal CKD. In this case, the phase comparison circuit 60 outputs time difference data representing the measured time difference as the phase difference data PD.

In FIG. 1, the clock signal CKD is inputted to the phase comparison circuit 60, but not necessarily, and a clock signal based on an oscillation signal only needs to be inputted to the phase comparison circuit 60. For example, the clock signal CK may be directly inputted from the oscillation circuit 150 to the phase comparison circuit 60.

The processing circuit 50 performs a variety of types of digital signal processing based on the phase difference data PD and outputs frequency control data LQ as the result of the processing. The processing circuit 50 includes a Kalman filter 51, a selector 53, and a loop filter 52. The processing circuit 50 is, for example, a DSP (Digital Signal Processor). In this case, the DSP carries out processes associated with the Kalman filter 51, the selector 53, and the loop filter 52 in a time division manner. Instead, the Kalman filter 51, the selector 53, and the loop filter 52 may be formed of separate logic circuits.

The Kalman filter 51 performs Kalman filtering using the phase difference data PD as an observed value to estimate a true value of the phase difference data PD. The true value represents an aging characteristic of the oscillation frequency. The true value is also called an estimated value. An index value RLB is also inputted from the second circuit device 200 to the Kalman filter 51, and the Kalman filter 51 performs the Kalman filtering based on the index value RLB. The index value RLB represents the reliability of the state of a received satellite signal. The index value RLB is inputted, for example, in the form of digital data to the Kalman filter 51. The better the state of a received satellite signal, the higher the reliability. The higher the reliability is, the greater the index value RLB may be, or the higher the reliability is, the smaller the index value RLB may be. The Kalman filter 51 increases the Kalman gain when the reliability is high and decreases the Kalman gain when the reliability is low. As a result, the lower the reliability, the smaller the effect on the observed value in the Kalman filtering. That is, the aging estimation is affected by a smaller degree by a lower-reliability reference signal CKRF.

A holdover evaluation signal SHL, which represents whether or not a holdover state has occurred, is inputted to the Kalman filter 51. The holdover state is a state in which the reference signal CKRF has been lost or has become abnormal. For example, it is assumed that the holdover evaluation signal SHL has a low level in the non-holdover state and the holdover evaluation signal SHL has a high level in the holdover state. The Kalman filter 51 estimates the true value as long as the holdover evaluation signal SHL has the low level, holds the true value when the holdover evaluation signal SHL changes from the low level to the high level, and outputs the held true value as estimated phase difference data EPD. The low level is a first logical level in a broad sense, and the high level is a second logical level in a broad sense.

The selector 53 selects the phase difference data PD when the holdover evaluation signal SHL has the low level and outputs the phase difference data PD as output data SQ and selects the estimated phase difference data EPD when the holdover evaluation signal SHL has the high level and outputs the estimated phase difference data EPD as the output data SQ.

The loop filter 52 performs loop filtering on the output data SQ. The loop filter 52 performs the loop filtering on the output data SQ and outputs the result of the loop filtering as the frequency control data LQ. The loop filtering is lowpass filtering, and is, for example, lowpass filtering including an integral.

The oscillation signal generation circuit 140 uses the frequency control data LQ and a resonator XTAL to generate an oscillation signal having an oscillation frequency set by the frequency control data LQ. The oscillation signal generation circuit 140 outputs the clock signal CK based on the oscillation signal. The oscillation signal generation circuit 140 includes, for example, a buffer circuit that buffers the oscillation signal, and an output signal from the buffer circuit is outputted as the clock signal CK. The oscillation signal generation circuit 140 includes a D/A conversion circuit 80 and the oscillation circuit 150.

The D/A conversion circuit 80 D/A-converts the frequency control data LQ and outputs control voltage VQ corresponding to the frequency control data LQ. A resistor string type, a resistor ladder type, a capacitance array type, or any of a variety of other types can be employed as the type of the D/A conversion circuit 80.

The oscillation circuit 150 uses the control voltage VQ and the resonator XTAL to generate the oscillation signal. The oscillation circuit 150 is connected to the resonator XTAL and causes the resonator XTAL to oscillate at an oscillation frequency controlled by the control voltage VQ to generate the oscillation signal. The oscillation circuit 150 is, for example, a VCO (Voltage Controlled Oscillator). The VCO includes a drive circuit that drives the resonator XTAL and a variable capacitance capacitor. The driver circuit has a first node connected to one end of the resonator XTAL and a second node connected to the other end of the resonator XTAL. One end of the variable capacitance capacitor is connected to the first or second node, and the capacitance of the variable capacitance capacitor is controlled by the control voltage VQ to control the oscillation frequency.

The configuration of the oscillation signal generation circuit 140 is not limited to the configuration shown in FIG. 1. For example, the oscillation signal generation circuit 140 may include an oscillation circuit and a variable capacitance circuit connected to the oscillation circuit. The variable capacitance circuit includes a capacitor array and a switch array including switch elements turned on or off based on the frequency control data LQ. The switch elements are each turned on or off, so that the number of capacitors that form the capacitor array and are connected to the one end of the resonator XTAL changes. As a result, the capacitance of the variable capacitance circuit is controlled, and the oscillation frequency is in turn controlled. Instead, the oscillation signal generation circuit 140 may be achieved by a direct digital synthesizer method. In this case, digital computation based on the frequency control data LQ is performed on the oscillation signal from the resonator XTAL to generate the oscillation signal having the oscillation frequency corresponding to the frequency control data LQ.

The second circuit device 200 receives a satellite signal from a navigation satellite and outputs the reference signal CKRF based on the satellite signal. That is, the second circuit device 200 is a receiver that receives the satellite signal. The navigation satellite is a satellite that forms a navigation satellite system (NSS) and is, for example, a satellite that forms a global positioning system (GPS), a quasi-zenith satellite system (QZSS), or any other system. The satellite signal is a wireless signal transmitted from the satellite and is used for the navigation in the navigation system. The second circuit device 200 does not need to be a component that forms the navigation system and only needs to generate the reference signal CKRF from the satellite signal. The satellite signal contains time data, data on the position of the satellite, satellite number data, and other data. The second circuit device 200 generates a time pulse signal, such as 1-pulse-per-second (1PPS) signal, from the satellite signal and outputs the time pulse signal as the reference signal CKRF to the circuit device 100.

The second circuit device 200 acquires parameters relating to the state of the received satellite signal. The parameters include, for example, the number of navigation satellites from which a satellite signal is receivable, the intensity of the received satellite signal, and the elevation angle of each of the navigation satellites. The number of navigation satellites from which a satellite signal is receivable is the number of navigation satellites captured by the second circuit device 200. The parameters may instead be dilution of precision (DOP) in the GPS. The parameters relate to the reliability of the state of the received satellite signal, that is, the accuracy of the time pulse signal. That is, it is believed that the greater the number of captured satellites, the more accurate the time pulse signal. Further, the higher the intensity of the received satellite signal, the more accurate the time pulse signal. Still further, the greater the elevation angle of each of the navigation satellites, the more accurate the time pulse signal. The second circuit device 200 determines the index value RLB representing the reliability from one or more of the parameters. The second circuit device 200 may use one of the parameters as the index value RLB. The second circuit device 200 outputs the determined index value RLB to the circuit device 100.

The second circuit device 200 is, for example, an integrated circuit device. The circuit device 100 and the second circuit device 200 may be separate integrated circuit devices or may be integrated into a single integrated circuit device.

Figure 2:
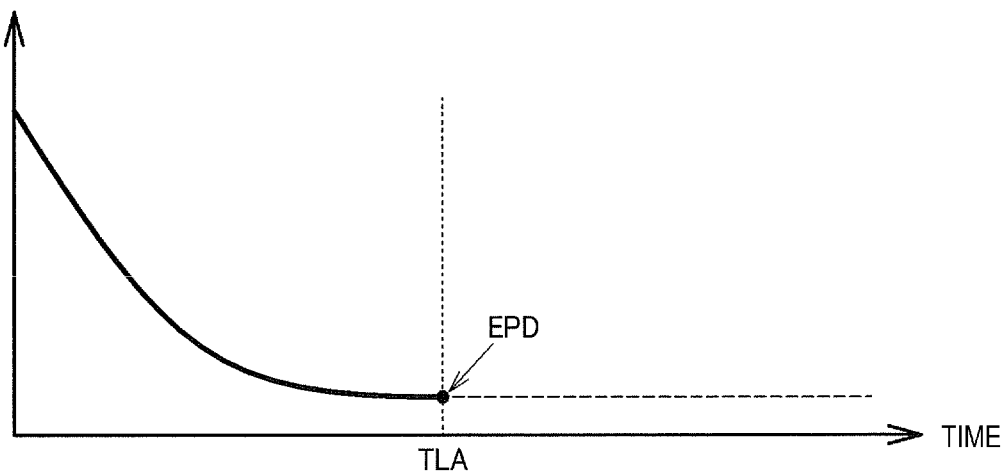
FIG. 2 describes the action of the circuit device.
Figure 2:
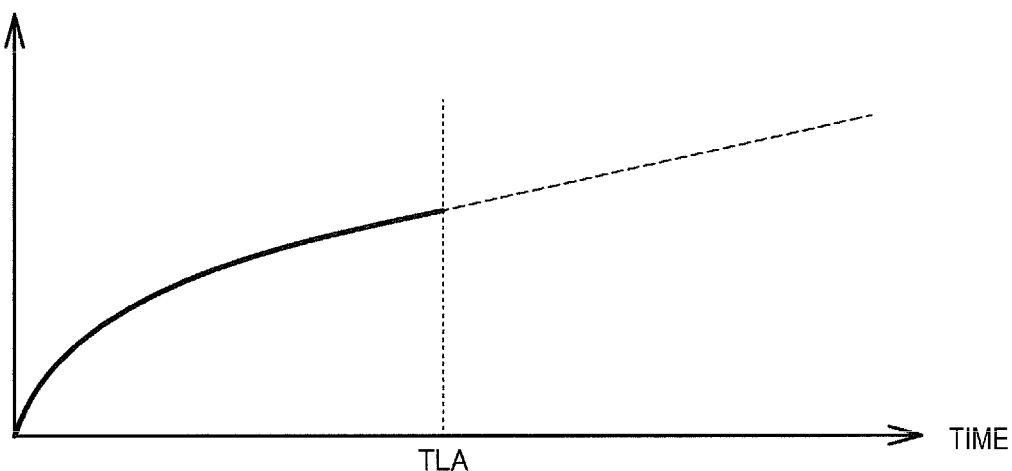
Figure 2:
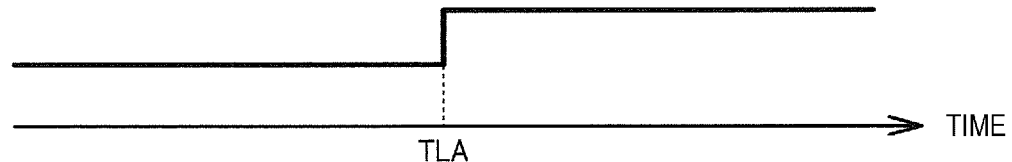

FIG. 2 describes the action of the circuit device 100. Basic aging estimation and aging correction will be described with reference to FIG. 2, and aging estimation using the reliability will be described later.

In FIG. 2, the period ending at time TLA corresponds to the non-holdover state, and the period starting at the time TLA corresponds to the holdover state.

The action in the period before the time TLA will first be described. When the holdover evaluation signal SHL has the low level, the selector 53 selects the phase difference data PD from the phase comparison circuit 60, so that the phase comparison circuit 60, the loop filter 52, and the oscillation signal generation circuit 140 form a PLL circuit. The PLL circuit performs feedback control in such a way that the phase of the clock signal CK is locked to the phase of the reference signal CKRF. In the following description, the "PLL circuit" means a PLL circuit formed of the phase comparison circuit 60, the loop filter 52, and the oscillation signal generation circuit 140 in the non-holdover state.

If the processing circuit 50 keeps inputting the same frequency control data LQ to the oscillation signal generation circuit 140, the oscillation frequency changes due to aging. That is, the frequency control data LQ for achieving the same oscillation frequency changes. Since the PLL circuit performs the feedback control in such a way that a fixed oscillation frequency is provided, the aging changes the frequency control data LQ. Since the frequency control data LQ is the result of the integral of the phase difference data PD, the time average of the phase difference data PD changes by the amount corresponding to the time derivative of the frequency control data LQ. However, since the phase difference data PD is outputted at every phase comparison timing, the phase difference data PD actually varies from the time average on the positive and negative sides thereof.

The temporal change in the frequency control data LQ due to the aging can be approximately considered as a first-order change. When the frequency control data LQ undergoes a first-order change with time, the time average of the phase difference data PD corresponds to the gradient of the temporal change in the frequency control data LQ. Since the Kalman filter 51 estimates the true value of the phase difference data PD, the true value is a value corresponding to the gradient of the temporal change in the frequency control data LQ.

The action in the period after the time TLA will next be described. When the non-holdover state transitions to the holdover state and the holdover evaluation signal SHL changes from the low level to the high level, the Kalman filter 51 holds the estimated value as the estimated phase difference data EPD. The estimated value is an estimated true value. The estimated phase difference data EPD corresponds to the gradient of the frequency control data LQ at the time TLA.

When the holdover evaluation signal SHL has the high level, the selector 53 selects the estimated phase difference data EPD, and the loop filter 52 integrates the estimated phase difference data EPD. Since the estimated phase difference data EPD corresponds to the gradient of the temporal change in the frequency control data LQ due to the aging, integral of the gradient determines an estimated value of the frequency control data LQ. The estimated value is frequency control data LQ having under gone correction of the temporal change due to the aging. The oscillation signal generation circuit 140 oscillates based on the frequency control data LQ described above. The aging correction is thus performed on the oscillation frequency.

Figure 3:
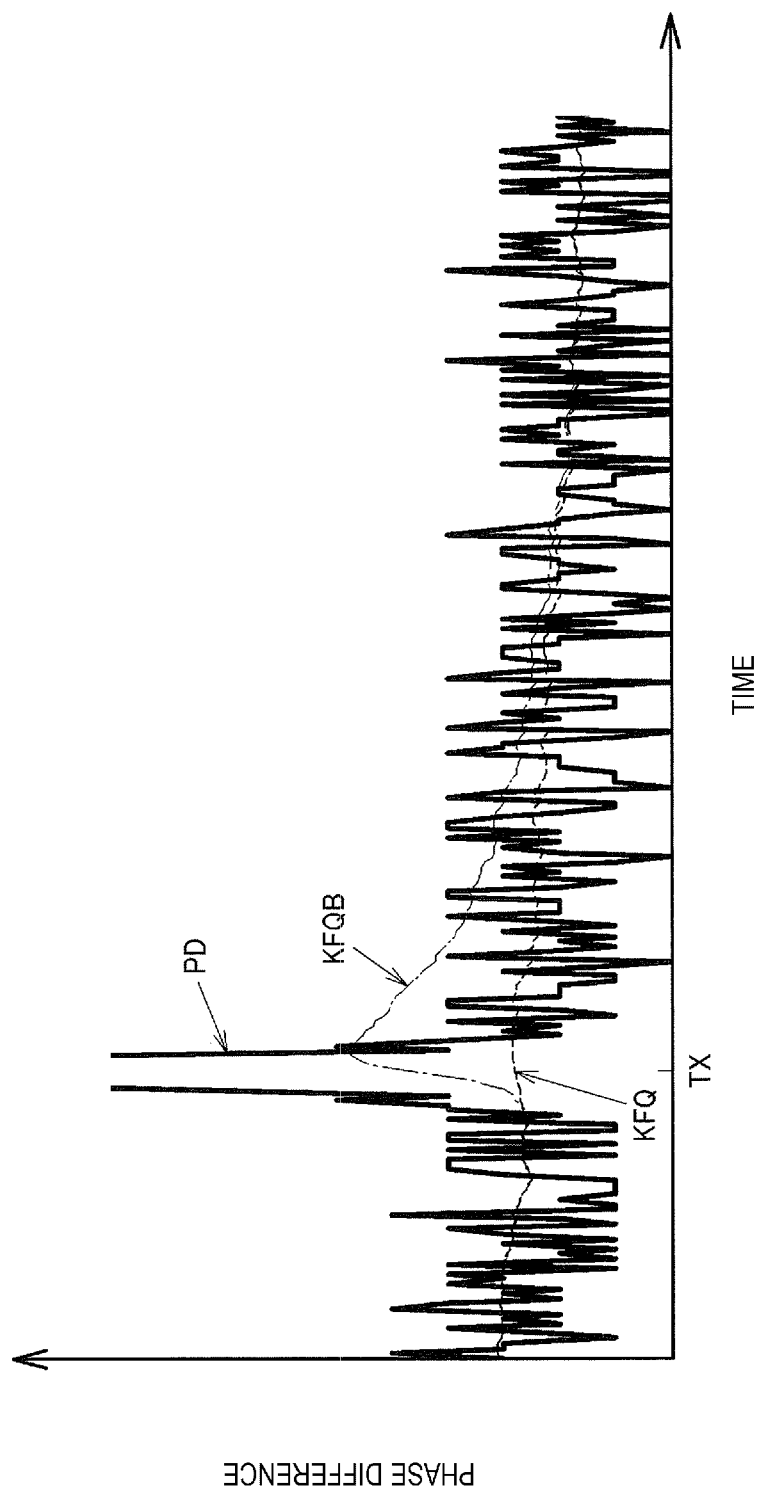
FIG. 3 describes aging estimation using reliability.
Figure 4:
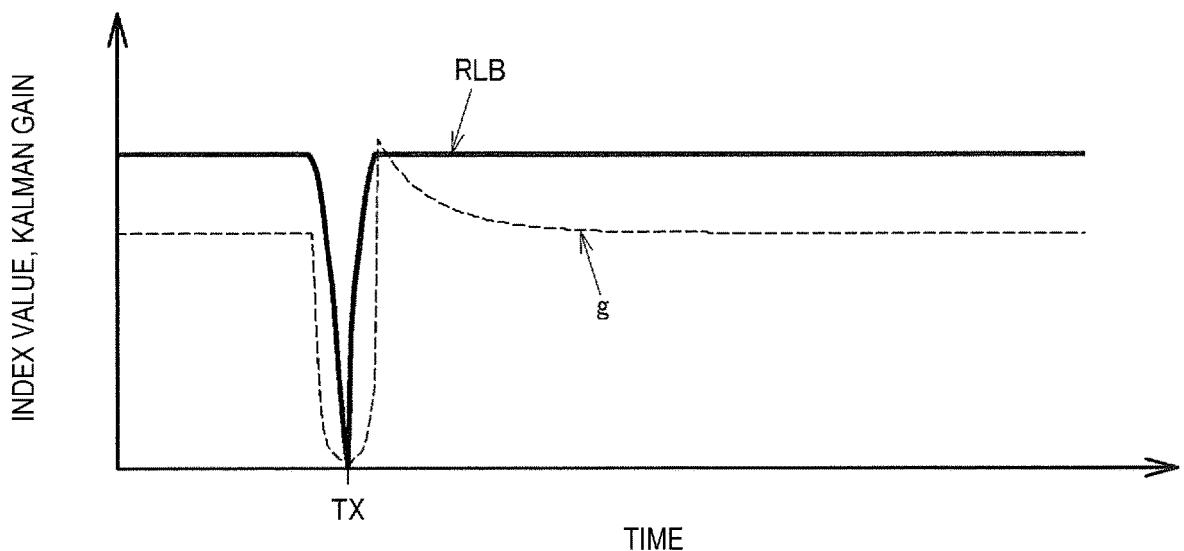
FIG. 4 describes the aging estimation using the reliability.
Figure 5:
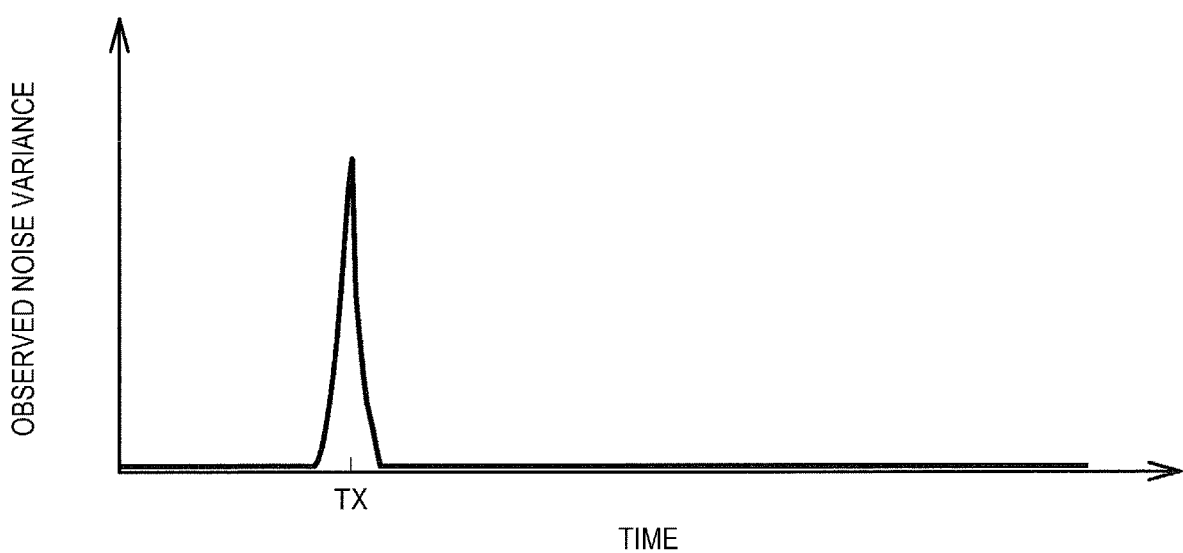
FIG. 5 describes the aging estimation using the reliability.

FIGS. 3 to 5 describe the aging estimation using the reliability. In FIG. 3, KFQ is an estimated value that the Kalman filter 51 estimates by using the reliability, and KFQB is an estimated value that the Kalman filter 51 estimates by using no reliability. In FIG. 4, g represents the Kalman gain. In the following description, it is assumed that when the reliability of the state of the received satellite signal decreases, the index value RLB representing the reliability decreases.

It is now assumed that the reference signal CKRF is unstable at time TX and the phase difference data PD therefore greatly varies, as shown in FIG. 3. Conceivable examples of the case described above may include a case where a poor state of the received satellite signal causes an error in the cycle of the reference signal CKRF and a case where a poor state of the received satellite signal causes a missing pulse in the reference signal CKRF. It is assumed that the Kalman filter 51 determines the estimated value KFQB from the phase difference data PD without using the reliability. In this case, the large variation in the phase difference data PD affects and changes the estimated value KFQB. For example, in a case where the estimated value KFQB has already converged to a true value, the estimated value KFQB deviates from the true value.

On the other hand, in the present embodiment, the Kalman filter 51 uses the reliability to perform the Kalman filtering. Specifically, the index value RLB, which represents the reliability, decreases at the time TX, as shown in FIG. 4. The Kalman filter 51 has a smaller gain when the index value RLB is smaller. The estimated value KFQ is therefore unlikely to be affected by the variation in the phase difference data PD, as shown in FIG. 3. For example, in the case where the estimated value KFQ has already converged to a true value, the estimated value KFQ is unlikely to deviate from the true value. Instead, when the estimated value KFQ is in the course of convergence to a true value, the convergence to the true value can be accelerated because the estimated value KFQ is unlikely to be affected by the variation in the phase difference data PD.

The Kalman filter 51 increases observed noise variance when the reliability is low to lower the Kalman gain, as shown in FIG. 5. The approach of controlling the Kalman gain in accordance with the reliability is not limited to the approach described above. That is, the Kalman filter 51 may lower the Kalman gain by decreasing system noise variance when the reliability is low. Instead, when the reliability is low, the Kalman filter 51 may lower the Kalman gain by increasing the observed noise variance and decreasing the system noise variance.

According to the embodiment described above, the circuit device 100 includes the oscillation signal generation circuit 140, which uses the resonator XTAL to generate the oscillation signal, and the processing circuit 50. The processing circuit 50 estimates the aging characteristic of the oscillation frequency of the resonator XTAL based on the result of the comparison between the phase of the reference signal CKRF, which is based on the satellite signal transmitted from the navigation satellite, and the phase of the clock signal CKD, which is based on the oscillation signal. In this process, the processing circuit 50 estimates the aging characteristic based on the index value RLB representing the reliability of the state of the received satellite signal and the result of the phase comparison.

Since a poor state of the received satellite signal lowers the precision of the reference signal CKRF, the precision of the aging estimation could lower. For example, the reliability of the state the received satellite signal is believed to lower in a case where the number of satellites captured by the second circuit device 200 is small, a case where the quality of the satellite signal decreases due to a multipath phenomenon, or a case where the intensity of the received satellite signal decreases. The multipath phenomenon refers to a situation in which the satellite signal reflected off a geographic feature or a building is received. According to the present embodiment, when the processing circuit 50 estimates the aging characteristic from the result of the phase comparison, the estimation action can be controlled based on the reliability of the state of the received satellite signal. The effect of low reliability on the reference signal CKRF can therefore be reduced, whereby the precision of the aging estimation can be improved. Further, the period required to follow the true value in the aging estimation can be shortened.

For example, it is conceivable to use the clock signal generated by the circuit device 100 as a reference clock signal in wireless communication. In mobile communication, inter-car communication, communication between a traffic infrastructure and a car, or any other type of communication, since the satellite signal is blocked by a building or a geographic feature, it is conceivable that the holdover state occurs in a relatively frequent manner. In this case, it is desirable to precisely perform the aging estimation in a short period in the non-holdover state. The present embodiment, which allows the estimation action to be controlled by using the reliability of the state of the received satellite signal, allows precise aging estimation in a short period in the non-holdover state. A high-precision clock signal can thus be generated even in the holdover state. The mobile communication and the other types of communication are examples of application of the present disclosure, and the application of the present disclosure is not limited thereto.

2. Kalman Filter

Figure 6:
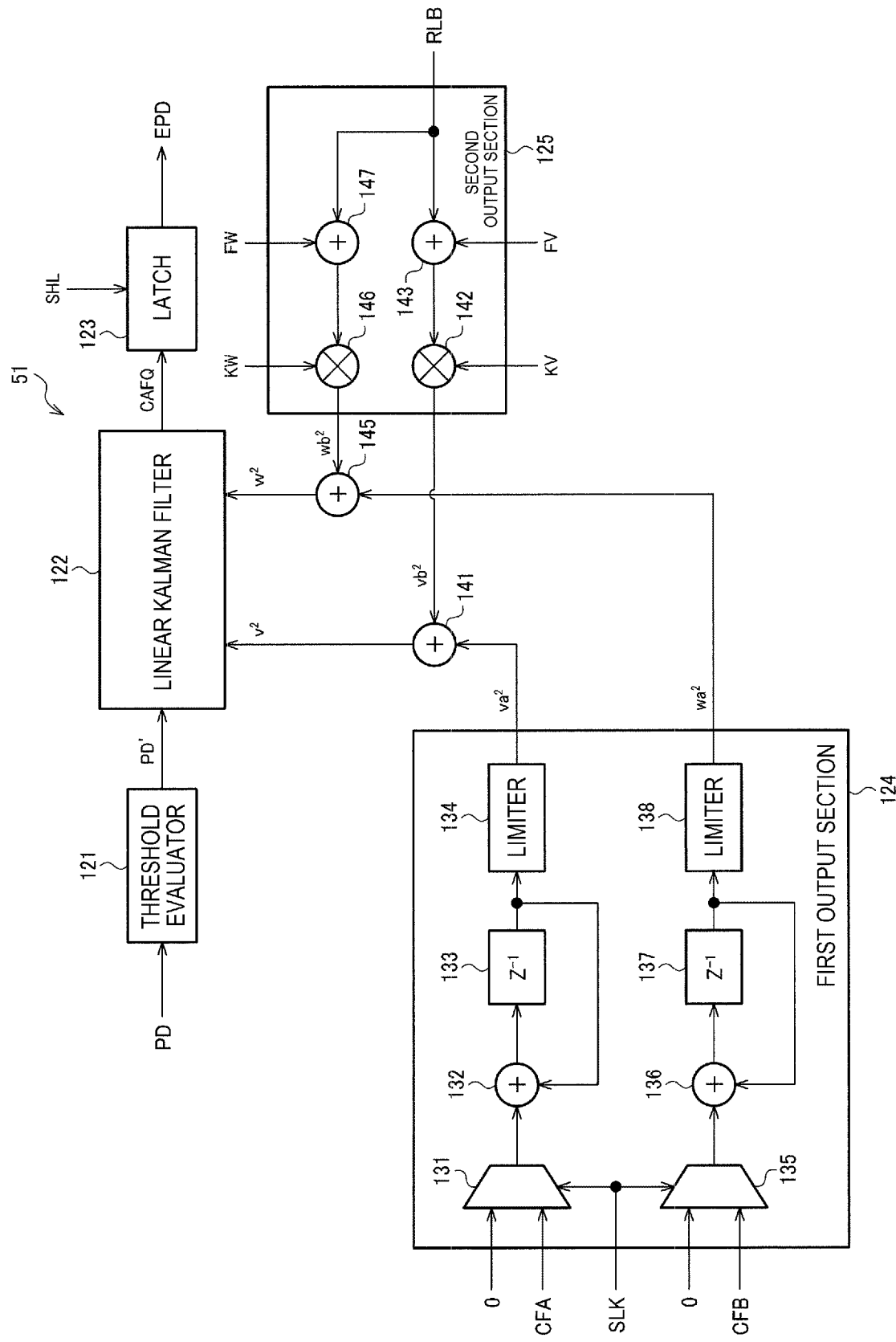
FIG. 6 shows a detailed configuration example of a Kalman filter.

FIG. 6 is a detailed configuration example of the Kalman filter 51. The Kalman filter 51 includes a threshold evaluator 121, a linear Kalman filter 122, a latch 123, a first output section 124, a second output section 125, an adder 141, and an adder 145. In the following description, it is assumed that the higher the reliability, the greater the index value RLB.

The threshold evaluator 121 evaluates the phase difference data PD from the phase comparison circuit 60 based on a threshold. The threshold evaluator 121 outputs the phase difference data PD as output data PD' when the phase difference data PD is smaller than or equal to a threshold and restricts the phase difference data PD to the value equal to the threshold when the phase difference data PD is greater than the threshold.

The first output section 124 outputs system noise variance $va^2$ and observed noise variance $wa^2$. Specifically, the first output section 124 changes the system noise variance $va^2$ and observed noise variance $wa^2$ after the PLL circuit is locked. As a result, after the PLL circuit is locked, the Kalman gain in the Kalman filtering decreases. The process of changing the system noise variance $va^2$ is called a first process. The system noise variance $va^2$ is data outputted as the result of the first process. The process of changing the observed noise variance $wa^2$ is called a second process. The observed noise variance $wa^2$ is data outputted as the result of the second process.

The second output section 125 outputs system noise variance $vb^2$ and observed noise variance $wb^2$ based on the index value RLB representing the reliability. The second output section 125 includes an adder 143, which subtracts the index value RLB from an offset FV, and a multiplier 142, which multiplies the output from the adder 143 by a gain KV. The multiplier 142 outputs the result of the multiplication as the system noise variance $vb^2$. The system noise variance $vb^2$ is also called first data. The second output section 125 further includes an adder 147, which subtracts the index value RLB from an offset KW, and a multiplier 146, which multiplies the output from the adder 147 by a gain KW. The multiplier 146 outputs the result of the multiplication as the observed noise variance $wb^2$. The observed noise variance $wb^2$ is also called second data. The offsets FV and FW and the gains KV and KW are stored, for example, in a storage section 30 shown in FIG. 9.

The adder 141 adds the system noise variance $va^2$ and the system noise variance $vb^2$ to each other and outputs the result of the addition as system noise variance $v^2$ to the linear Kalman filter 122. The adder 145 adds the observed noise variance $wa^2$ and the observed noise variance $wb^2$ to each other and outputs the result of the addition as observed noise variance $w^2$ to the linear Kalman filter 122. The following expression (1) shows $v^2$ and $w^2$. KV<0 and KW>0. FV and FW are so set that FV-RLB>0 and FW-RLB>0 are satisfied.

That is, the smaller the index value RLB, the smaller than system noise variance $v^2$, and the greater the observed noise variance $w^2$.

$$v^2 = va^2 + KV \times (FV - RLB)$$

$$w^2 = wa^2 + KW \times (FW - RLB) \quad (1)$$

In FIG. 6, the second output section 125 outputs the system noise variance $vb^2$ and the observed noise variance $wb^2$, but not necessarily. That is, the second output section 125 may output only the system noise variance $vb^2$. In this case, the adder 145, the multiplier 146, and the adder 147 are omitted. Instead, the second output section 125 may output only the observed noise variance $wb^2$. In this case, the adder 141, the multiplier 142, and the adder 143 are omitted.

The linear Kalman filter 122 performs the Kalman filtering using the output data PD' from the threshold evaluator 121 as the observed value based on the set system noise variance $v^2$ and observed noise variance $w^2$. The linear Kalman filter 122 outputs an estimated value as output data CAFQ. The latch 123 holds the output data CAFQ outputted when the level of the holdover evaluation signal SHL transitions from the low level to the high level and outputs the held output data CAFQ as the estimated phase difference data EPD.

The linear Kalman filter 122 performs the Kalman filtering based on Expression (2) to (6) shown below. The following Expressions (2) and (3) are each a time update expression, and the following Expression (4) to (6) are each an observation update expression.

$$\hat{x}^-(k) = \hat{x}(k-1) \quad (2)$$

$$P^-(k) = P(k-1) + v^2(k) \quad (3)$$

$$g(k) = \frac{P^-(k)}{P^-(k) + w^2(k)} \quad (4)$$

$$\hat{x}(k) = \hat{x}^-(k) + g(k) \times (y(k) - \hat{x}^-(k)) \quad (5)$$

$$P(k) = (1 - g(k)) \times P^-(k) \quad (6)$$

In Expression (2) to (6) described above, $\hat{x}(k)$ represents a posterior estimated value in a time step k, and $\hat{x}^-(k)$ represents a prior estimated value in the time step (k). The term P(k) represents posterior covariance in the time step k, and $P^-(k)$ represents prior covariance in the time step k. The term g(k) represents the Kalman gain in the time step k. The term y(k) represents an observed value in the time step k. The term $v^2(k)$ represents the system noise variance in the time step k, and $w^2(k)$ represents the observed noise variance in the time step k. The symbol "^" in $\hat{x}$ and other terms is expressed a superscript of x for convenience. The observed value y(k) is output data PD' from the threshold evaluator 121 in FIG. 6. The posterior estimated value $\hat{x}(k)$ is the output data CAFQ from the linear Kalman filter 122.

In a convergence state of the Kalman filtering expressed by Expressions (2) to (6) described above, the frequency characteristic of the Kalman filtering includes a lowpass filter characteristic, and Expression (7) shown below is approximately satisfied. The convergence state is a state in which variation in the Kalman gain and the estimated value decreases because the estimated value follows the observed value.

$$g \cong \frac{v}{w} \cong \frac{2\pi fc}{fs} \quad (7)$$

In Expression (7) described above, g represents the Kalman gain in the convergence state, v represents the root square of the system noise variance, and w represents the root square of the observed noise variance. The term fc represents the cutoff frequency of the lowpass filter characteristic of the linear Kalman filter 122 in the convergence state. The term fs represents the operating frequency of the linear Kalman filter 122, that is, the sampling frequency thereof.

Expression (7) described above shows that controlling the system noise variance $v^2$ and the observed noise variance $w^2$ allows control of the Kalman gain g in the convergence state. Expression (7) described above also shows that controlling the Kalman gain g allows control of the cutoff frequency fc because the cutoff frequency fc of the lowpass filter characteristic in the convergence state is determined by the Kalman gain g. That is, in the convergence state of the Kalman filtering, the linear Kalman filter 122 operates as a lowpass filter having the cutoff frequency fc set by the system noise variance $v^2$ and the observed noise variance $w^2$.

The lower the reliability, the greater the observed noise variance $w^2$ and the smaller the system noise variance $v^2$, as described with reference to FIGS. 3 to 6. Expression (7) described above shows that the lower the reliability, the smaller the Kalman gain. That is, since the lower the reliability, the lower the cutoff frequency fc, whereby the estimated value is unlikely to vary even when the observed value varies due to a decrease in the reliability.

The first output section 124 includes selectors 131 and 135, adders 132 and 136, delay elements 133 and 137, and limiters 134 and 138, as shown in FIG. 6.

A lock evaluation signal SLK is inputted to the first output section 124. The lock evaluation signal SLK is a signal representing whether or not the PLL circuit in FIG. 1 in the non-holdover state has been locked and is inputted, for example, from a lock evaluation circuit 70 in FIG. 9. In the following description, it is assumed that the lock evaluation signal SLK has the high level in the locked state, and that the lock evaluation signal SLK has the low level in the non-locked state.

The selector 131 selects a coefficient 0 when the lock evaluation signal SLK has the low level and selects a coefficient CFA when the lock evaluation signal SLK has the high level. The coefficient CFA is stored, for example, in the storage section 30 in FIG. 9. The adder 132 and the delay element 133 form a first integrator, and the first integrator integrates output data from the selector 131. The delay element 133 is a latch circuit or a register. When the lock evaluation signal SLK has the low level, a first initial value is set in the delay element 133. When the lock evaluation signal SLK has the high level, the data held by the delay element 133 is updated by the process carried out by the first integrator. The limiter 134 carries out a first restriction process of restricting the output data from the first integrator to a value equal to a first restriction value as the upper limit and outputs the processed data as the system noise variance $v^2$. The first restriction value is stored, for example, in the storage section 30 in FIG. 9.

The selector 135 selects the coefficient 0 when the lock evaluation signal SLK has the low level and selects a coefficient CFB when the lock evaluation signal SLK has the high level. The coefficient CFB is stored, for example, in the storage section 30 in FIG. 9. The adder 136 and the delay element 137 form a second integrator, and the second integrator integrates output data from the selector 135. The delay element 137 is a latch circuit or a register. When the lock evaluation signal SLK has the low level, a second initial value is set in the delay element 137. When the lock evaluation signal SLK has the high level, the data held by the delay element 137 is updated by the process carried out by the second integrator. The limiter 138 carries out a second restriction process of restricting the output data from the second integrator to a value equal to a second restriction value as the upper limit and outputs the processed data as the observed noise variance $w^2$. The second restriction value is stored, for example, in the storage section 30 in FIG. 9.

Figure 7:
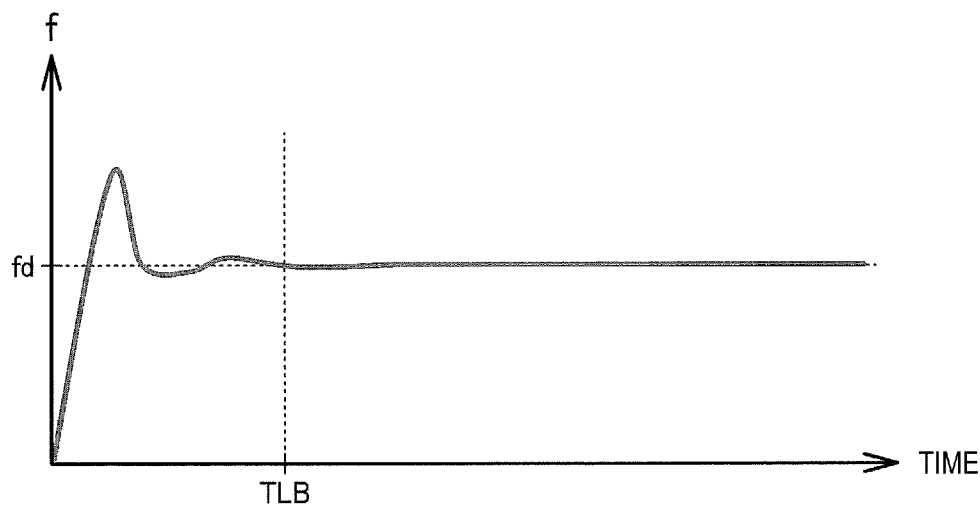
FIG. 7 describes the action of the Kalman filter.
Figure 7:
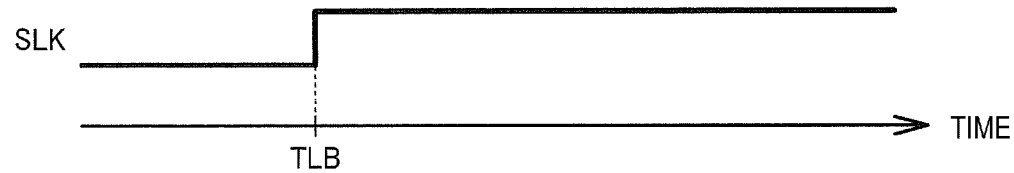
Figure 7:
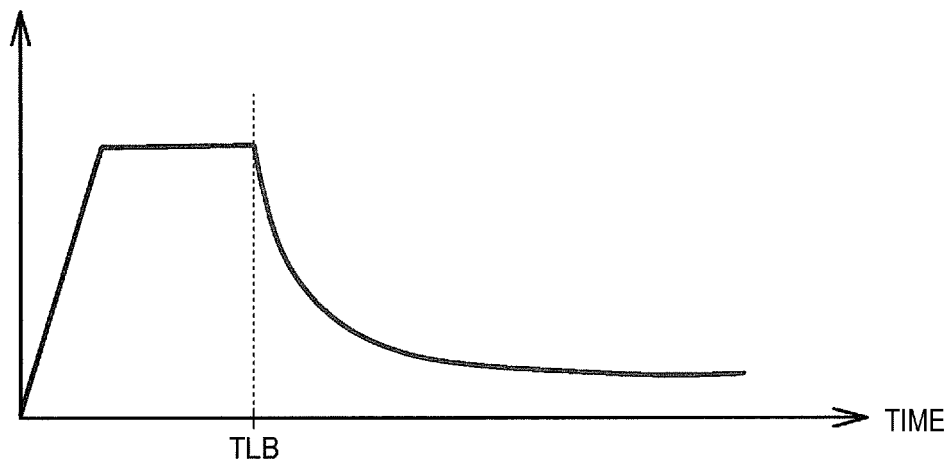

FIG. 7 describes the action of the Kalman filter 51 in FIG. 6. The description will be made on the assumption that the index value RLB is fixed. The action in the case where the index value RLB varies has been described with reference to FIGS. 3 to 5.

When the PLL circuit in FIG. 1 starts the action of locking the reference signal CKRF, an oscillation frequency f converges to a target frequency fd. The lock evaluation signal SLK transitions from the low level to the high level at a timing TLB, at which the oscillation frequency f sufficiently approaches the target frequency fd.

Since the selectors 131 and 135 select the coefficient 0 as long as the lock evaluation signal SLK has the low level, the first integrator keeps outputting the first initial value, and the second integrator keeps outputting the second initial value. That is, the system noise variance $v^2$ and the observed noise variance $w^2$ do not change. In this case, the Kalman gain g(k) of the linear Kalman filter 122 converges to a fixed value. When the Kalman gain g(k) converges to the fixed value, the linear Kalman filter 122 operates as a lowpass filter having the cutoff frequency fc determined by Expression (7) described above.

Since the selector 131 selects the coefficient CFA when the lock evaluation signal SLK has the high level, the output data from the first integrator decreases from the first initial value. In this process, CFA<0. The system noise variance $v^2$ decreases from the first initial value to the first restriction value and is then maintained at the first restriction value. The process is the first process described above. Since the selector 135 selects the coefficient CFB, the output data from the second integrator increases from the second initial value. In this process, CFB>0. The observed noise variance $w^2$ increases from the second initial value to the second restriction value and is then maintained at the second restriction value. The process is the second process described above.

In the present embodiment, at least one of the first and second processes described above is carried out. In the case where only the first process is carried out, it is assumed that CFA<0 and CFB=0. In the case where only the second process is carried out, it is assumed that CFA=0 and CFB>0. In the case where the first and second processes are carried out, it is assumed that CFA<0 and CFB>0. Carrying out at least one of the first and second processes lowers the Kalman gain g(k) after the timing TLB and approaches a fixed value, as shown in FIG. 7. The cutoff frequency fc provided when the Kalman gain converges to the fixed value is determined by Expression (7) described above. In Expression (7) described above, since the smaller the Kalman gain g, the lower the cutoff frequency fc, the cutoff frequency fc after the timing TLB is lower than the cutoff frequency fc before the timing TLB.

3. Second Configuration Example of Circuit Device

Figure 8:
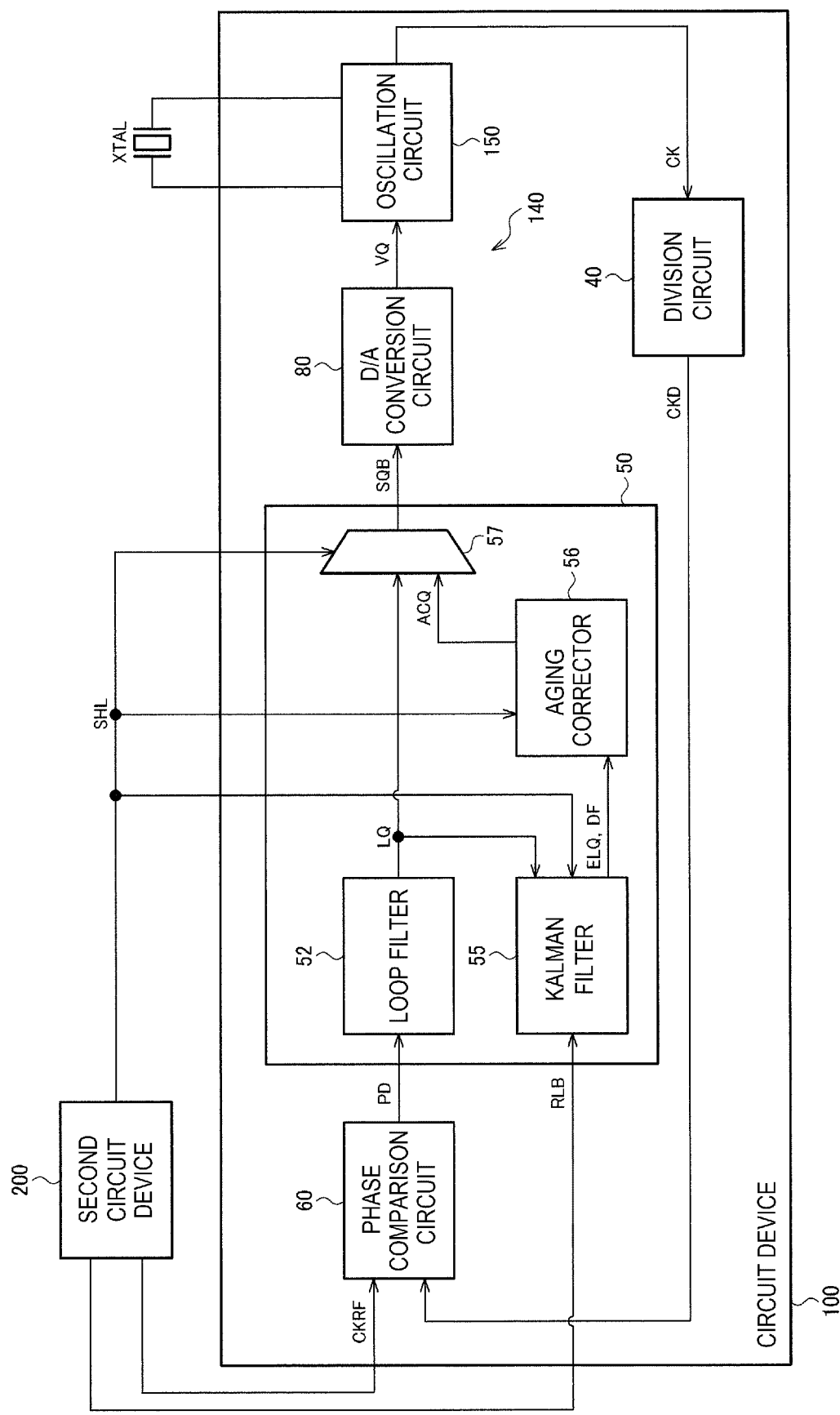
FIG. 8 shows a second configuration example of the circuit device.

FIG. 8 shows a second configuration example of the circuit device 100. In FIG. 8, the processing circuit 50 includes the loop filter 52, a Kalman filter 55, an aging corrector 56, and a selector 57. The same components as those described in FIG. 1 have the same reference characters, and description of the same components will be omitted as appropriate.

The loop filter 52 performs the loop filtering on the phase difference data PD and outputs the result of the loop filtering as the frequency control data LQ.

The Kalman filter 55 performs the Kalman filtering using the frequency control data LQ as the observed value to estimate the true value of the frequency control data LQ and the gradient of the temporal change in the true value. The Kalman filter 55 increases the Kalman gain when the reliability is high and decreases the Kalman gain when the reliability is low. For example, the Kalman filter 55 controls the Kalman gain by using the same approach shown in FIG. 6. The Kalman filter 55 performs the estimation or holds the true value based on the holdover evaluation signal SHL. That is, the Kalman filter 55 estimates the true value and the gradient in the non-holdover state, holds the true value and the gradient when the non-holdover state changes to the holdover state, outputs the held true value as the estimated frequency control data ELQ, and outputs the held gradient as estimated gradient data DF.

The aging corrector 56 performs the aging correction based on the estimated frequency control data ELQ, the estimated gradient data DF and the holdover evaluation signal SHL. That is, the aging corrector 56 outputs output data ACQ=ELQ+k×DF in the holdover state. The term k represents the number of updates stating from 0. The update cycle of the output data ACQ is the same as the cycle at which the loop filter 52 updates the frequency control data LQ.

The selector 57 selects the frequency control data LQ or the output data ACQ based on the holdover evaluation signal SHL and outputs the selected data as output data SQB to the oscillation signal generation circuit 140. The selector 57 selects the frequency control data LQ in the non-holdover state and selects the output data ACQ in the holdover state. That is, in the holdover state, the frequency control data corrected by the aging corrector 56 is inputted to the oscillation signal generation circuit 140.

4. Oscillator, Clock Signal Generator, Electronic Apparatus, and Vehicle

Figure 9:
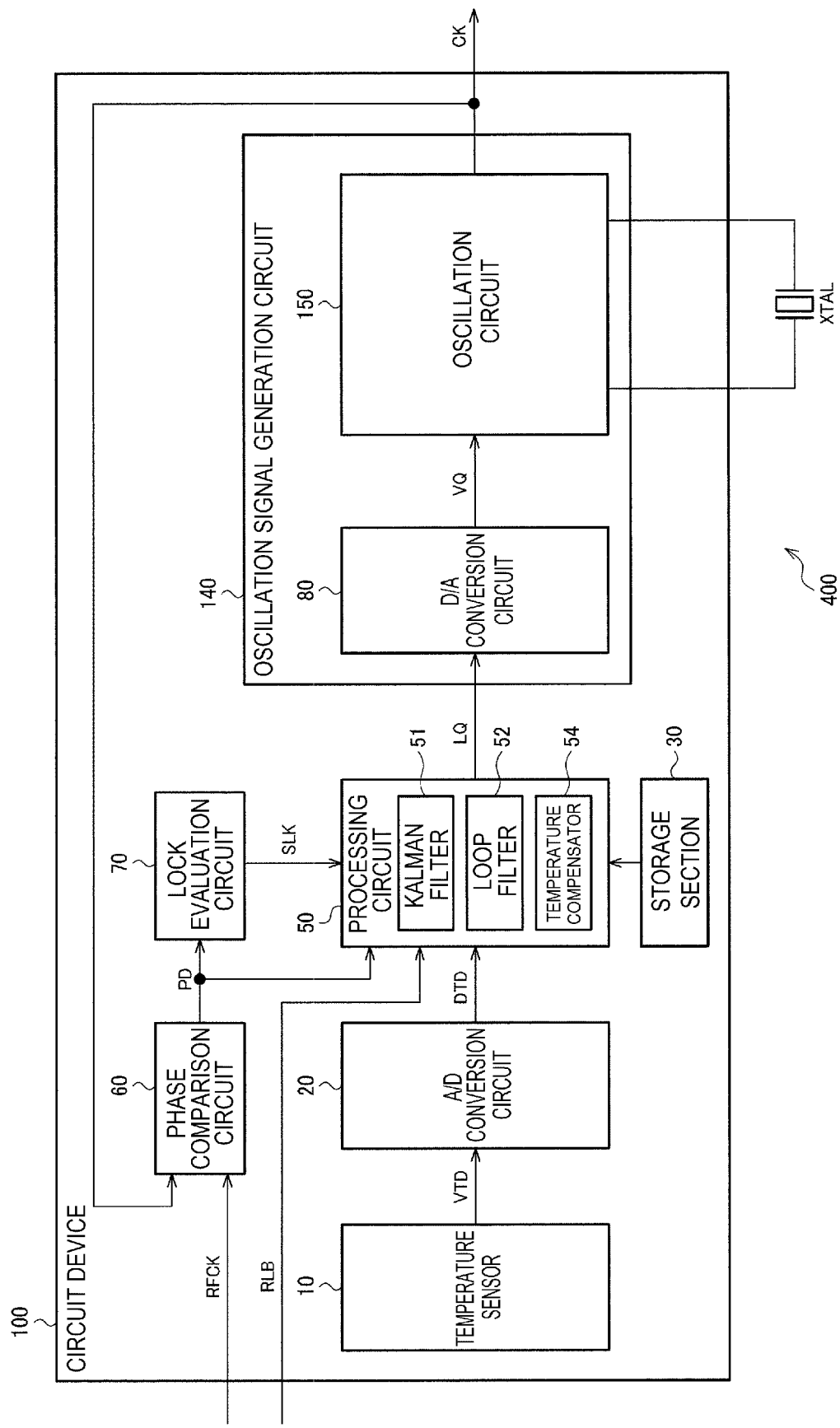
FIG. 9 shows a configuration example of an oscillator and a third configuration example of the circuit device.

FIG. 9 shows a configuration example of an oscillator 400 and a third configuration example of the circuit device 100. The oscillator 400 includes the resonator XTAL and the circuit device 100. The circuit device 100 is a circuit device that achieves a digital oscillator, such as a TCXO (Temperature Compensated Xtal Oscillator) and an OCXO (Oven Controlled Xtal Oscillator). The circuit device 100 is, for example, an integrated circuit device. A digital oscillator is achieved, for example, by accommodating the circuit device 100 and the resonator XTAL in a package.

The circuit device 100 includes a temperature sensor 10, an A/D conversion circuit 20, the storage section 30, the processing circuit 50, the oscillation signal generation circuit 140, the phase comparison circuit 60, and the lock evaluation circuit 70. Instead, the processing circuit 50 may contain the phase comparison circuit 60, and the processing circuit 50 may contain the lock evaluation circuit 70. The temperature sensor may be provided as a component external to the circuit device 100. In this case, the externally provided temperature sensor inputs temperature detection voltage representing a detected temperature to the circuit device 100.

The temperature sensor 10 outputs temperature dependent voltage that changes in accordance with the environmental temperature as temperature detection voltage VTD. The environmental temperature is, for example, the temperature of a substrate of the circuit device 100 or the temperature of the resonator XTAL. The temperature sensor 10 generates the temperature dependent voltage by using a circuit element having temperature dependence and outputs the temperature dependent voltage with respect to temperature independent voltage. For example, the temperature dependent voltage is outputted based on the forward voltage of a PN junction. The temperature independent voltage is, for example, bandgap reference voltage.

The A/D conversion circuit 20 performs A/D conversion of the temperature detection voltage VTD from the temperature sensor 10 and outputs the result of the conversion as temperature detection data DTD. The A/D conversion scheme can, for example, be a successive comparison, flash, pipeline, or double integral scheme.

The processing circuit 50 performs a variety of types of digital signal processing. The processing circuit 50 includes the Kalman filter 51, the loop filter 52, and a temperature compensator 54. The Kalman filter 51 performs the Kalman filtering by using the phase difference data PD from the phase comparison circuit 60 as the observed value. The loop filter 52 performs the loop filtering on the phase difference data PD from the phase comparison circuit 60 when the lock evaluation signal SLK indicates the non-locked state and performs the loop filtering on the estimated phase difference data held by the Kalman filter 51 when the lock evaluation signal SLK indicates the locked state. The temperature compensator 54 performs temperature compensation that compensates the temperature characteristic of the oscillation frequency of the resonator XTAL based on the temperature detection data DTD. Specifically, the temperature compensator 54 substitutes the temperature detection data DTD into an approximate function that reduces variation in the oscillation frequency due to a change in the temperature to determine temperature compensation data. The temperature compensator 54 corrects the output data from the loop filter 52 based on the temperature compensation data and outputs the corrected data as the frequency control data LQ. The processing circuit 50 is a logic circuit. For example, the processing circuit 50 is a DSP (Digital Signal Processor) or an ASIC. The processing circuit 50 may instead be achieved in the form of a processor and a program running on the processor. The processor is, a CPU, an MPU, or any other device.

The oscillation signal generation circuit 140 includes the D/A conversion circuit 80 and the oscillation circuit 150. The configuration of the oscillation signal generation circuit 140 is not limited to the configuration described above, as described with reference to FIG. 1. The D/A conversion circuit 80 D/A-converts the frequency control data LQ and outputs the control voltage VQ corresponding to the frequency control data LQ. The oscillation circuit 150 causes the resonator XTAL at the oscillation frequency corresponding to the control voltage VQ and outputs the clock signal CK based on the oscillation signal from the resonator XTAL.

The storage section 30 stores information on the settings of the action of the circuit device 100, a variety of parameters used by the processing circuit 50, and other pieces of information. For example, the storage section 30 stores the coefficients CFA and CFB, the first and second initial values, the first and second restriction values, the gains KV and KW, the offsets FV and FW shown in FIG. 6. The storage section 30 further stores a coefficient of the approximate function used in the temperature compensation. The storage section 30 is, for example, a nonvolatile memory. Alternatively, the storage section 30 may be a register or a RAM. Instead, the circuit device 100 may include an interface circuit that is not shown, and an external processing device may set the parameters, such as the coefficient CFA, in the storage section 30 via the interface circuit.

The phase comparison circuit 60 compares the phase of the reference signal CKRF with the phase of the clock signal CK and outputs the result of the comparison as the phase difference data PD to the processing circuit 50. The phase comparison circuit 60 is, for example, a counter or a time digital conversion circuit.

The lock evaluation circuit 70 evaluates whether or not the PLL circuit has been locked based on the phase difference data PD and outputs the result of the evaluation as the lock evaluation signal SLK to the processing circuit 50. The PLL circuit is formed of the phase comparison circuit 60, the loop filter 52, and the oscillation signal generation circuit 140. The lock evaluation circuit 70 accumulates the phase difference data PD, for example, from the time before a predetermined period to the current time and determines that the PLL circuit has been locked when the accumulated value is smaller than or equal to a predetermined value.

Figure 10:
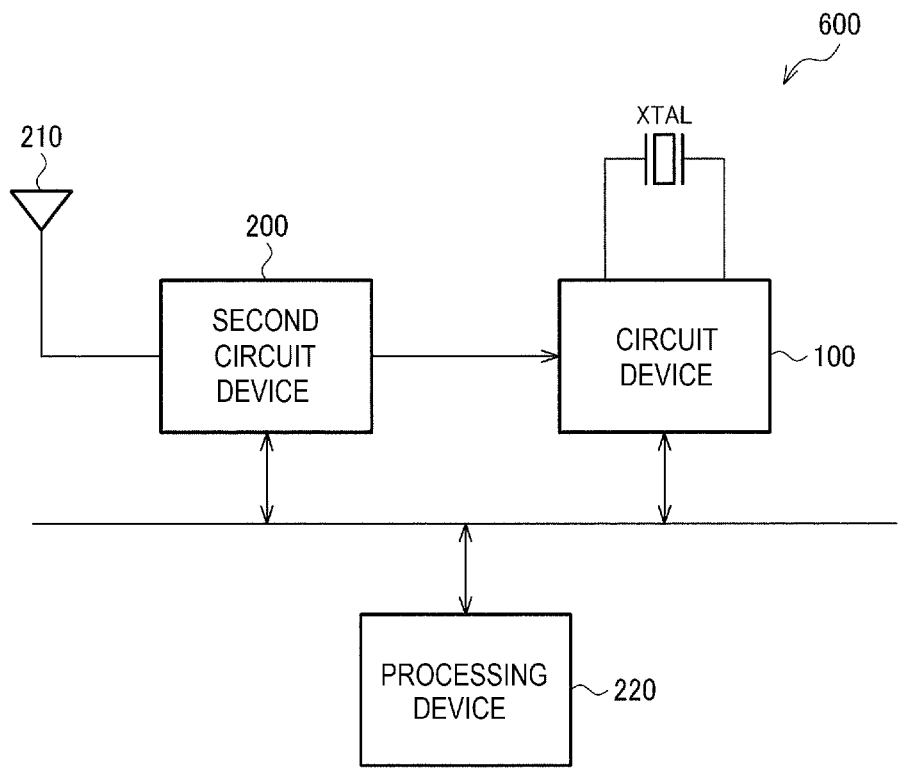
FIG. 10 shows a configuration example of a clock signal generator.

FIG. 10 shows a configuration example of a clock signal generator 600 including the circuit device 100. The clock signal generator 600 includes the circuit device 100, the second circuit device 200, an antenna 210, a processing device 220, and the resonator XTAL.

The antenna 210 receives the satellite signal from the navigation satellite. The second circuit device 200 receives the satellite signal based on the signal inputted from the antenna 210. The second circuit device 200 generates an index value representing the reliability and a reference signal based on the satellite signal and outputs the index value representing the reliability and the reference signal to the circuit device 100. The circuit device 100 generates a clock signal synchronized with the reference signal. The circuit device 100 further performs the aging estimation based on the reliability and uses the result of the aging estimation to perform the aging correction in the holdover state. The circuit device 100 thus performs free-running oscillation in the holdover state, and the frequency of the oscillation has undergone the aging correction. The processing device 220 controls the circuit device 100 and the second circuit device 200. The processing device 220 performs, for example, initial setting or action setting of the circuit device 100 and the second circuit device 200. The processing device 220 is, for example, a CPU, an MPU, or any other processor.

The clock signal generated by the clock signal generator 600 is used, for example, as a reference clock signal in wireless communication. That is, an electronic apparatus including the clock signal generator 600 can further include a wireless communication circuit. The wireless communication circuit then uses the clock signal from the clock signal generator 600 to transmit or receive a wireless signal.

Figure 11:
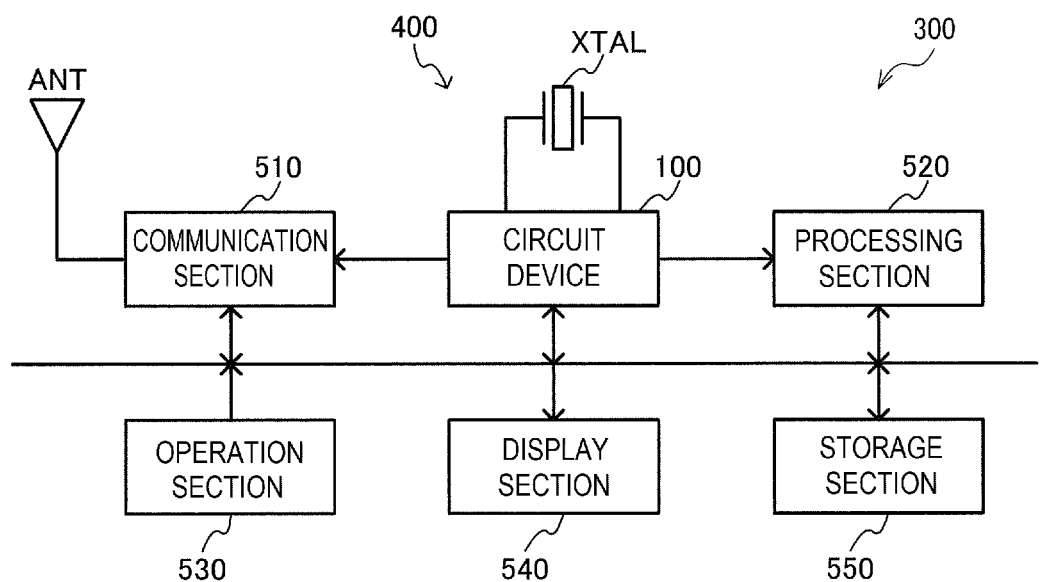
FIG. 11 shows a configuration example of an electronic apparatus.

FIG. 11 shows a configuration example of an electronic apparatus 300 including the circuit device 100. The electronic apparatus 300 includes the oscillator 400, which includes the circuit device 100 and the resonator XTAL, and a processing section 520. The electronic apparatus 300 can further include a communication section 510, an operation section 530, a display section 540, a storage section 550, and an antenna ANT.

A variety of apparatuses are conceivable as the electronic apparatus 300. Conceivable examples of the electronic apparatus 300 may include a timepiece with a built-in GPS, a biological information measuring apparatus, and a wearable apparatus, such as a head mounted display. Conceivable examples of the biological information measuring apparatus may include a pulse wave meter and a pedometer. Other conceivable examples of the electronic apparatus 300 may include a smartphone, a mobile phone, a portable game console, a notebook PC, a tablet PC, and other portable information terminals. Still other conceivable examples of the electronic apparatus 300 may include a content providing terminal that distributes a content, a digital camera, a video camcorder, and other video apparatuses, and a base station, a router, and other network-related apparatuses. Still other conceivable examples of the electronic apparatus 300 may include a measurement apparatus that measures a physical quantity, such as a distance, a time period, a flow speed, and a flow rate, an in-vehicle apparatus, and a robot. The in-vehicle apparatus is, for example, an apparatus for automatic driving.

The communication section 510 receives data from an external apparatus and transmits data to the external apparatus via the antenna ANT. The communication section 510 is, for example, a communication circuit. The processing section 520 controls the electronic apparatus and performs a variety of types of digital processing on the data transmitted and received via the communication section 510. The function of the processing section 520 can be achieved, for example, by a microcomputer or any other processor. The operation section 530 allows a user to perform input operation and can be achieved by operation buttons, a touch panel display, or any other component. The operation section 530 is, for example, an operation device. The display section 540 displays a variety of pieces of information and can be achieved by a liquid crystal display, an organic EL display, or any other display. The storage section 550 stores data, and the function thereof can be achieved by a RAM, a ROM, or any other semiconductor memory, a hard disk drive, or any other component.

Figure 12:
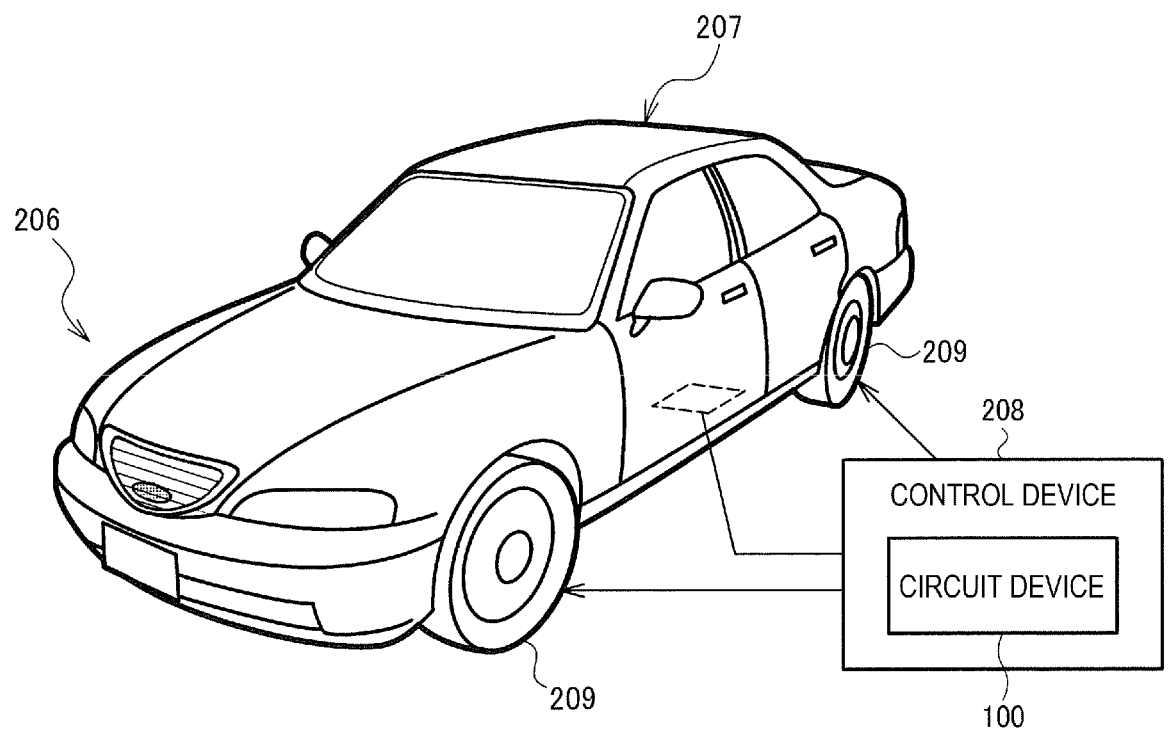
FIG. 12 shows an example of a vehicle.

FIG. 12 shows an example of a vehicle including the circuit device 100. The circuit device 100 can be incorporated in a variety of vehicles, for example, a car, an airplane, a motorcycle, a bicycle, a robot, and a ship. The vehicle is, for example, any of apparatuses and devices that include an engine, a motor, or any other drive mechanism, a steering wheel, a rudder, or any other steering mechanism, and a variety of electronic apparatuses and travel on the ground, in the sky, or on the sea. FIG. 12 schematically shows an automobile 206 as a specific example of the vehicle. The automobile 206 incorporates an oscillator that is not shown but includes the circuit device 100. A control device 208 performs a variety of types of control based on a clock signal generated by the oscillator. The control device 208, for example, controls the degree of hardness of the suspension in accordance with the posture of a vehicle body 207 and performs braking control on individual wheels 209. An apparatus that incorporates the circuit device 100 or the oscillator is not necessarily incorporated in the control device 208 and can be incorporated in a variety of apparatuses provided in the automobile 206, a robot, and other vehicles.

According to the embodiment described above, the circuit device includes the oscillation signal generation circuit, which generates the oscillation signal by using the resonator, and the processing circuit. The processing circuit estimates the aging characteristic of the oscillation frequency of the resonator based on the result of the comparison between the phase of the reference signal based on the satellite signal transmitted from the navigation satellite and the phase of the clock signal based on the oscillation signal. In this process, the processing circuit estimates the aging characteristic based on the index value representing the reliability of the state of the received satellite signal and the result of the phase comparison.

Therefore, when the processing circuit estimates the aging characteristic from the result of the phase comparison, the estimation action can be controlled based on the reliability of the state of the received satellite signal. As a result, the effect of the reference signal in the case of low reliability can be reduced, whereby the precision of the aging estimation can be improved. Further, the period required to follow the true value in the aging estimation can be shortened.

In the present embodiment, the processing circuit may estimate the aging characteristic by performing the Kalman filtering based on the result of the phase comparison and the index value.

The processing circuit can therefore estimate the aging characteristic from the result of the phase comparison by performing the Kalman filtering using the result of the phase comparison as the observed value. The processing circuit can control the Kalman filtering based on the reliability of the state of the received satellite signal.

In the present embodiment, the processing circuit may change the Kalman gain in the Kalman filtering based on the index value.

The processing circuit can therefore change the Kalman gain in the Kalman filtering in accordance with the reliability of the state of the received satellite signal. In the Kalman filtering, the posterior estimated value is observed and updated based on the prior estimated value, the Kalman gain, and the observed value. In this process, the change in the Kalman gain changes the weighting of the observed value in the update of the posterior estimated value. That is, changing the Kalman gain in accordance with the reliability of the state of the received satellite signal can change the effect of the observed value on the estimated value.

In the present embodiment, the processing circuit may change at least one of the observed noise variance and the system noise variance in the Kalman filtering based on the index value.

In the Kalman filtering, the prior covariance is updated over time based on the system noise variance. The Kalman gain is overserved and updated based on the prior covariance and the observed noise variance. That is, changing at least one of the observed noise variance and the system noise variance based on the index value can change the Kalman gain in accordance with the reliability of the state of the received satellite signal.

In the present embodiment, the processing circuit may generate the observed noise variance and the system noise variance and perform the Kalman filtering by using the observed noise variance and the system noise variance, and in the generation of the observed noise variance and the system noise variance, the ratio of the observed noise variance to the system noise variance may be increased by an amount corresponding to lowness of the reliability represented by the index value.

The Kalman filter operates as a lowpass filter in the convergence state of the Kalman filtering. The ratio of the observed noise variance to the system noise variance determines the cutoff frequency of the lowpass filter. The smaller the ratio of the observed noise variance to the system noise variance, the lower the cutoff frequency. That is, increasing the ratio of the observed noise variance to the system noise variance by an amount corresponding to lowness of the reliability can lower the cutoff frequency. The lower the cutoff frequency is, the smaller the effect of the observed value on the estimated value can be.

In the present embodiment, the processing circuit may carry out the first process of changing the system noise variance from the first initial value in the generation of the observed noise variance and the system noise variance and may add the first data based on the index value to the data outputted as the result of the first process.

Changing the system noise variance from the first initial value can therefore change the cutoff frequency of the lowpass filter characteristic in the convergence state. The ability of the estimated value to follow the observed value can thus be controlled. Specifically, the Kalman gain is increased when the Kalman filter starts operating to increase the cutoff frequency, and the Kalman gain is then decreased to lower the cutoff frequency. As a result, the ability of the estimated value to follow the observed value can be improved when the Kalman filter starts operating, and the estimation precision after the estimated value follows the observed value can be improved. Further, adding the first data based on the index value to the data outputted as the result of the first process allows the system noise variance to change in accordance with the reliability. Specifically, decreasing the system noise variance by the amount corresponding to lowness of the reliability allows decrease in the Kalman gain.

In the present embodiment, the processing circuit may carry out the second process of changing the observed noise variance from the second initial value in the generation of the observed noise variance and the system noise variance and may add the second data based on the index value to the data outputted as the result of the second process.

Changing the observed noise variance from the second initial value can therefore change the cutoff frequency of the lowpass filter characteristic in the convergence state. The ability of the estimated value to follow the observed value can thus be controlled. Specifically, the Kalman gain is increased when the Kalman filter starts operating to increase the cutoff frequency, and the Kalman gain is then decreased to lower the cutoff frequency. As a result, the ability of the estimated value to follow the observed value can be improved when the Kalman filter starts operating, and the estimation precision after the estimated value follows the observed value can be improved. Further, adding the second data based on the index value to the data outputted as the result of the second process allows the observed noise variance to change in accordance with the reliability. Specifically, increasing the observed noise variance by the amount corresponding to lowness of the reliability allows decrease in the Kalman gain.

In the present embodiment, the index value may be information on at least one of the intensity of the received satellite signal, the number of navigation satellites from which the satellite signal is receivable, and the elevation angle of each of the navigation satellites.

The intensity of the received satellite signal, the number of navigation satellites from which the satellite signal is receivable, and the elevation angle of each of the navigation satellites affect the state of the received satellite signal and therefore affect the precision of the reference signal based on the satellite signal. That is, inputting at least one of the parameters described above as the index value to the circuit device allows aging estimation based on the reliability of the state of the received satellite signal.

In the present embodiment, the circuit device further includes the phase comparison circuit that compares the phase of the reference signal with the phase of the oscillation signal. The processing circuit generates the frequency control data based on the result of the phase comparison from the phase comparison circuit. The oscillation signal generation circuit uses the resonator and the frequency control data to generate an oscillation signal having an oscillation frequency set by the frequency control data.

The phase comparison circuit, the processing circuit, and the oscillation signal generation circuit form a PLL circuit. The PLL circuit generates a clock signal synchronized with the reference signal. The present embodiment allows high-precision aging estimation, as described above. Therefore, in the holdover state, the result of the aging estimation can be used to precisely perform the aging correction on the oscillation frequency. That is, in the holdover state, the oscillation signal generation circuit performs free-running oscillation but can generate a clock signal having a high-precision oscillation frequency in the free-running oscillation.

In the present embodiment, the oscillator includes the circuit device and the resonator.

In the present embodiment, the clock signal generator includes the circuit device, the resonator, and the second circuit device that receives the satellite signal.

In the present embodiment, the electronic apparatus includes the circuit device.

In the present embodiment, the vehicle includes the circuit device.

The present embodiment has been described above in detail, and a person skilled in the art will readily appreciate that a large number of variations are conceivable to the extent that they do not substantially depart from the novel items and advantageous effects of the present disclosure. Such variations are all therefore assumed to fall within the scope of the present disclosure. For example, a term described at least once in the specification or the drawings along with a different term having a boarder meaning or the same meaning can be replaced with the different term anywhere in the specification or the drawings. Further, any combination of the present embodiment and the variations fall within the scope of the present disclosure. Moreover, the configuration, action, and other factors of each of the circuit device, the oscillator, the clock signal generator, the electronic apparatus, and the vehicle are not limited to those described in the present embodiment, and a variety of changes can be made thereto.

What is claimed is:
1. A circuit device comprising:
an oscillation signal generation circuit that generates an oscillation signal by using a resonator; and
a processing circuit that estimates an aging characteristic of an oscillation frequency of the resonator based on a result of comparison between a phase of a reference signal based on a satellite signal transmitted from a navigation satellite and a phase of a clock signal based on the oscillation signal, wherein the processing circuit estimates the aging characteristic based on an index value representing reliability of a state of the received satellite signal and the result of the phase comparison, the index value being information on at least one of intensity of the received satellite signal, the number of navigation satellites from which the satellite signal is receivable, and an elevation angle of each of the navigation satellites.

2. The circuit device according to claim 1,
wherein the processing circuit estimates the aging characteristic by performing Kalman filtering based on the result of the phase comparison and the index value.

3. The circuit device according to claim 2,
wherein the processing circuit changes Kalman gain in the Kalman filtering based on the index value.

4. The circuit device according to claim 3,
wherein the processing circuit changes at least one of observed noise variance and system noise variance in the Kalman filtering based on the index value to change the Kalman gain.

5. The circuit device according to claim 2,
wherein the processing circuit generates observed noise variance and system noise variance and performs the Kalman filtering by using the observed noise variance and the system noise variance, and
in the generation of the observed noise variance and the system noise variance, a ratio of the observed noise variance to the system noise variance is increased by an amount corresponding to lowness of the reliability represented by the index value.

6. The circuit device according to claim 5,
wherein the processing circuit carries out a first process of changing the system noise variance from a first initial value in the generation of the observed noise variance and the system noise variance and adds first data based on the index value to data outputted as a result of the first process.

7. The circuit device according to claim 5,
wherein the processing circuit carries out a second process of changing the observed noise variance from a second initial value in the generation of the observed noise variance and the system noise variance and adds second data based on the index value to data outputted as a result of the second process.

8. The circuit device according to claim 1, further comprising
a phase comparison circuit that compares the phase of the reference signal with a phase of the oscillation signal,
wherein the processing circuit generates frequency control data based on the result of the phase comparison from the phase comparison circuit, and
the oscillation signal generation circuit uses the resonator and the frequency control data to generate the oscillation signal having the oscillation frequency set by the frequency control data.

9. An oscillator comprising:
the circuit device according to claim 1; and
the resonator.

10. A clock signal generator comprising:
the circuit device according to claim 1;
the resonator; and
a second circuit device that receives the satellite signal.

11. An electronic apparatus comprising the circuit device according to claim 1.

12. A vehicle comprising the circuit device according to claim 1.

* * * * *